United States Patent [19]

Chen

[11] 4,091,236
[45] May 23, 1978

[54] AUTOMATICALLY TUNABLE NOTCH FILTER AND METHOD FOR SUPPRESSION OF ACOUSTICAL FEEDBACK

[75] Inventor: Chun-Fu Chen, North Canton, Ohio

[73] Assignee: The University of Akron, Akron, Ohio

[21] Appl. No.: 720,842

[22] Filed: Sep. 7, 1976

[51] Int. Cl.² .................. H03G 5/16; H04M 1/20
[52] U.S. Cl. ...................... 179/1 FS; 179/1 D; 328/167
[58] Field of Search ............. 179/1 FS, 1 CN, 1 HF, 179/170.2, 81 B; 328/167; 333/17 R

[56] References Cited

U.S. PATENT DOCUMENTS

| | | | |
|---|---|---|---|
| 3,355,668 | 11/1967 | Boensel | 328/167 |
| 3,562,675 | 2/1971 | Urell | 328/167 |
| 3,624,298 | 11/1971 | Davis | 179/1 FS |

Primary Examiner—Kathleen H. Claffy
Assistant Examiner—Kenneth A. Chayt
Attorney, Agent, or Firm—Hamilton, Renner & Kenner

[57] ABSTRACT

Disclosed is an automatically tunable notch filter and method for suppression of acoustical feedback in an audio signal. The apparatus includes a selectively tunable notch filter having a center frequency which is variable over at least a substantial portion of the audio frequency spectrum. The apparatus receives an audio signal which is substantially non-periodic in the absence of acoustical feedback and substantially periodic with an instantaneous dominant frequency in the presence of the same. The duration of successive periods are monitored and compared by an up/down counter to determine whether the audio input signal is substantially periodic and to determine the instantaneous dominant frequency of such audio signal. Upon detection of an audio signal which is substantially periodic, the notch filter is tuned to the instantaneous dominant frequency so as to suppress the acoustical feedback.

22 Claims, 4 Drawing Figures

AUTOMATICALLY TUNABLE NOTCH FILTER AND METHOD FOR SUPPRESSION OF ACOUSTICAL FEEDBACK

BACKGROUND OF THE INVENTION

The present invention relates generally to a device and method for suppression of acoustical feedback. More particularly, the present invention relates to an automatically tunable notch filter and method for suppression of acoustical feedback.

Since the inception of electrical audio amplification systems, system instabilities have been known to result from the many varied acoustical paths between microphone and speaker. These system instabilities, otherwise known as acoustical feedback, result in electrical signals which, if permitted to go unattenuated, obliterate the desired audio signal.

A notch filter (also known as a band reject filter) is a well known device for substantially attenuating electrical signals between any two specified frequencies while not appreciably affecting signals at other frequencies outside this band. It is known that a notch filter tuned to a center frequency equal to a feedback frequency may be utilized for suppression of the feedback occurring at that frequency by holding the amplitude of the feedback signal to an acceptable level not conductive to feedback.

However, as a result of the nature of direct and multiple reflected acoustical paths between microphone and speaker, the frequency of acoustical feedback is unpredictable and may extend over a substantial portion of the audio frequency spectrum, which spectrum extends from frequencies of approximately 20 to 20,000 Hz. Therefore, in the past devices for suppression of acoustical feedback employed a plurality of discrete analog notch filters each selectively tuned to a portion of the audio frequency spectrum. Fortunately, the nature of acoustical feedback in general is such that at any given instant in time the acoustical feedback occurs at substantially a single frequency — the instantaneous dominant feedback frequency.

In one device the notch filters are individually sequencially interposed between an audio amplifier and a loudspeaker by manual switching until the acoustical feedback is eliminated by the fortuitous selection of the filter which suppresses that frequency at which the acoustical feedback is then occurring. As a result of the necessity for manual switching in a plurality of filters, these devices have a very slow response time, are expensive and occupy large spaces due to the large number of discrete filters required. Furthermore, because of the fact discrete filters are required, only a limited number of filter frequencies are obtainable, necessitating that each filter have a bandwidth substantially broader than desirable, thereby rendering the filtered audio signal of poor quality. Finally, because the feedback frequency may only be determined by experimentally testing one filter at a time, only one portion of the audio frequency spectrum may be manually surveyed at any given time for the feedback frequency. Because the acoustical feedback paths are likely to change very rapidly, it is entirely possible for the feedback frequency to change several times in the course of just one complete "survey" of all the filters and ultimately result in entirely missing the feedback frequency at any given instant in time.

More recently, spectrum analyzers have replaced the sequential searching aspect of the manual switching technique just described. Here, the spectrum analyzer can continually survey the audio frequency spectrum, still one frequency at a time, and provide an indication of the amplitude of the signal at each frequency. Upon detecting a signal of an amplitude greater than a predetermined level, the operator may manually switch in the appropriate filter which suppresses that frequency. Alternately, conventional control circuitry may be provided to automatically switch in the appropriate filter.

Because the spectrum analyzer still must survey one frequency at a time, this device is also subject to an undesirable slow response time. Moreover, the bulky nature and high cost of spectrum analyzers, and remaining necessity for using a plurality of discrete notch filters, further contribute to the existing deficiencies of the manual searching device.

Generally, most audio signals one may be desirous of amplifying are non-periodic in nature. This is especially true in the case of human speech: rarely, if at all, does a person repeat exactly the same sounds one immediately after the other. In the presence of acoustical feedback the audio signal is overridden by a periodic signal having a frequency substantially equal to the dominant feedback frequency and a substantially sinusoidal shape with the audio signal superimposed thereupon. Heretofore, there has been no recognition or application of this principle in the art of acoustical feedback suppression.

By definition, a periodic signal repeats itself in constant time intervals known as periods. Although a period may be taken to begin at any point in time, for convenience we may begin and end a period each alternate time the amplitude of the input signal is substantially zero (after allowing for everpresent electrical noise), which amplitude is referred to in the art as the "zero-crossing level."

Since generally audio signals are non-periodic, in the absence of acoustical feedback successive periods are generally unequal. On the other hand, in the presence of acoustical feedback a periodic signal occurs resulting in successive periods being substantially equal. I have found that by monitoring and comparing successive periods in an audio signal the presence of acoustical feedback and the instantaneous dominant frequency thereof may be quickly, accurately and precisely determined for use in an acoustical feedback suppression apparatus.

SUMMARY OF THE INVENTION

It is, therefore, an object of the invention to provide an apparatus and method for quickly, accurately and precisely determining the presence of acoustical feedback in an audio signal and thereupon suppressing the same.

It is another object of the invention to provide an apparatus and method for the suppression of acoustical feedback in an audio signal, as above, in which the acoustical feedback is detected and suppressed without deleteriously affecting other desired portions of the audio signal.

It is still another object of the invention to provide an apparatus and method for the suppression of acoustical feedback in an audio signal, as above, which simultaneously, automatically and continually surveys the entire portion of the audio frequency spectrum in which acoustical feedback is likely to occur, thereby providing a fast response time which insures detection and suppression of the instantaneous dominant feedback frequency.

It is yet another object of the invention to provide an apparatus and method for the suppression of acoustical feedback in an audio signal, as above, which utilizes only a single selectively tunable notch filter having a center frequency which is variable over at least a substantial portion of the audio frequency spectrum corresponding to that portion in which acoustical feedback is likely to occur, thereby permitting great compactness and a substantial reduction in cost over prior art devices.

It is a further object of the invention to provide an apparatus and method for the suppression of acoustical feedback in an audio signal, as above, which is tunable (dependent only on the selectivity of the notch filter) to a substantially greater number of center frequencies than would be possible with a plurality of discrete notch filters, thereby substantially increasing the accuracy of the filtering and improving the quality of the filtered audio signal.

It is still a further object of the invention to provide an apparatus and method for the suppression of acoustical feedback in an audio signal, as above, which monitors and compares successive periods in the audio signal so as to determine the presence of acoustical feedback and the instantaneous dominant frequency thereof.

It is yet a further object of the invention to provide an apparatus and method for the suppression of acoustical feedback in an audio signal, as above, in which successive periods are monitored by counting the output pulses from a count clock during each period.

It is an additional object of the invention to provide an apparatus and method for the suppression of acoustical feedback in an audio signal, as above, in which the monitored counts for successive periods are compared so as to determine the presence of acoustical feedback.

It is another object of the invention to provide an apparatus and method for the suppression of acoustical feedback, as above, in which, upon detection of the presence of acoustical feedback in the audio signal, the monitored count for the most recent period is utilized to determine the instantaneous dominant frequency of the acoustical feedback and to tune the center frequency of the notch filter to such frequency.

These and other objects and advantages of the present invention over existing prior art forms will become more apparent and fully understood from the following description in conjunction with the accompanying drawings.

In general, an apparatus and method embodying the concept of the present invention includes a notch filter having a center frequency which is variable over at least a substantial portion of the audio frequency spectrum and means for tuning the notch filter. The notch filter receives and selectively filters an audio signal. Upon the occurrence of a periodic audio signal the means for tuning the notch filter selectively tunes the notch filter to a center frequency substantially equal to the instantaneous dominant frequency thereof, whereupon such feedback is suppressed.

DESCRIPTION OF THE PREFERRED EMBODIMENT

Figure 1:
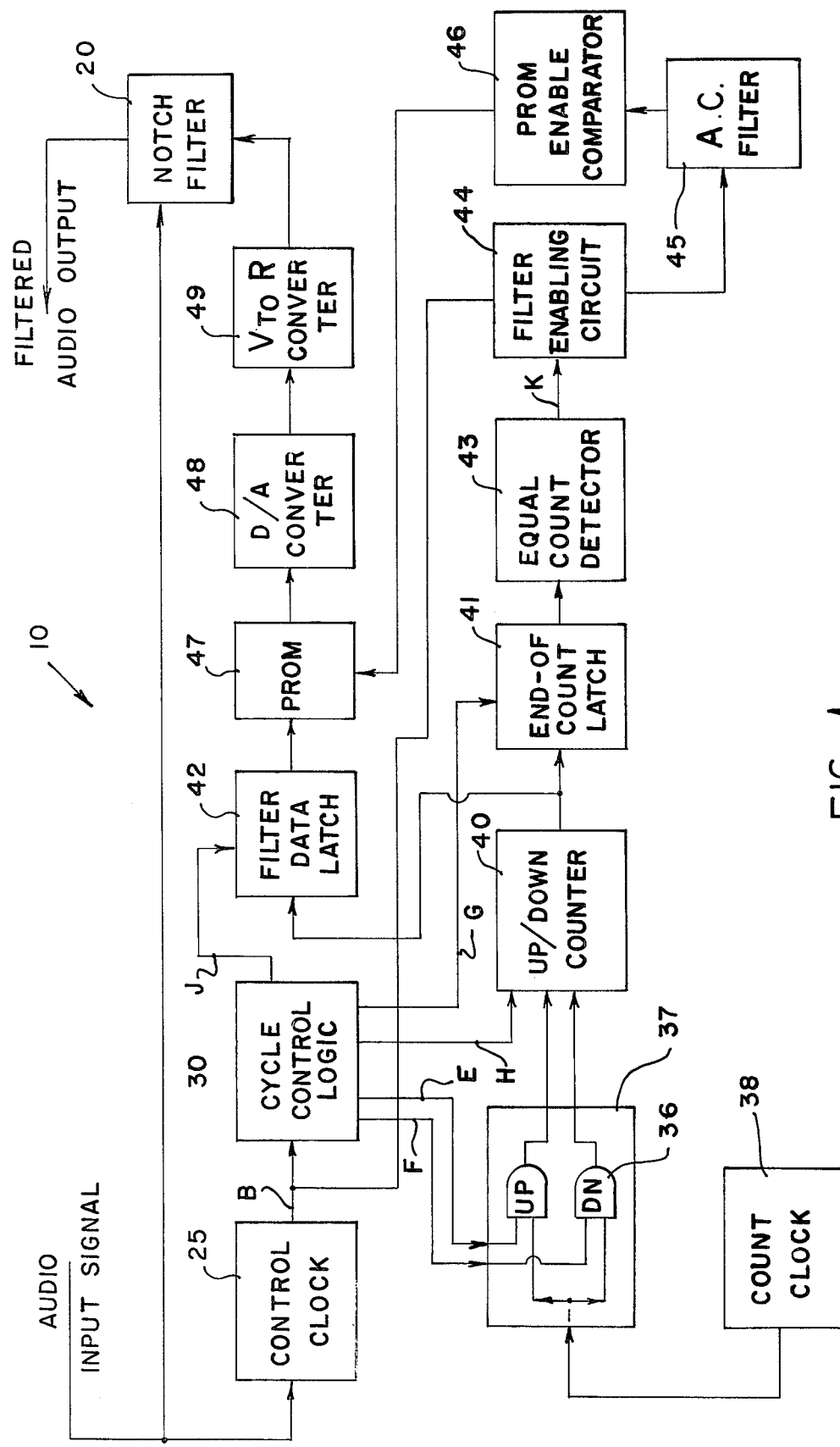
FIG. 1 is a block diagram of an exemplary apparatus according to the concept of the present invention.
Figure 2:
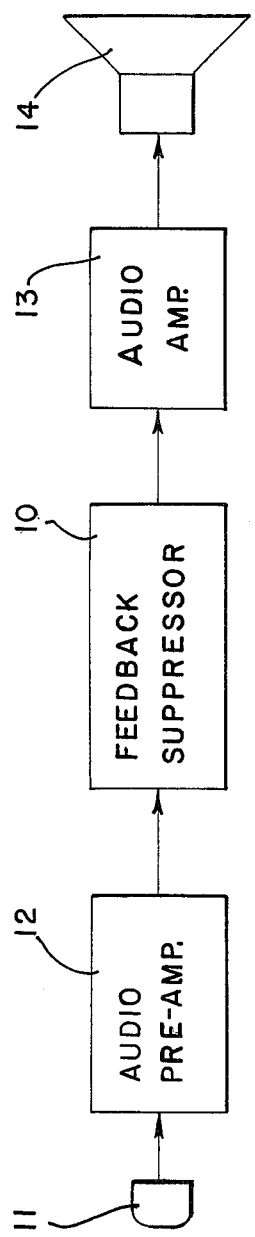
FIG. 2 is a partial block diagram depicting schematically the equipment in a conventional audio amplification system and further depicting in block form the apparatus of the present invention in an exemplary position in the system.

FIG. 1 depicts an apparatus and method for suppression of acoustical feedback which is generally indicated by the numeral 10. FIG. 2 illustrates the preferred position of the apparatus 10 (indicated therein with the words "feedback suppressor") in an audio amplification system. A microphone 11 converts an acoustical signal, such as a normal spoken word, into an electrical signal proportional to the acoustical signal, which signal is received and amplified by audio amplifier 12. Audio pre-amplifier 12 furnishes an output signal which shall hereinafter be referred to as the audio input signal, which signal is received and filtered by feedback suppressor 10 as described below, thereby suppressing an acoustical feedback. Feedback suppressor 10 furnishes an output signal hereinafter referred to as the filtered audio output, which signal may be further amplified by amplifier 13 and received by speaker 14 for reconversion into an amplified acoustical signal substantially without acoustically induced feedback. As would be evident to the skilled artisan, feedback suppressor 10 may be designed to directly receive the output from microphone 11. Moreover, as feedback suppressor 10 is amenable for utilization in any system in which acoustical feedback occurs, the position of feedback suppressor 10 within such a system is, of course, subject to further variation.

The present invention utilizes a single notch filter 20, illustrated in FIG. 1, receiving the audio input signal and furnishing a filtered audio output signal. Notch filter 20 is selectively tunable having a center frequency which is variable over at least a substantial portion of the audio frequency spectrum corresponding to that portion in which acoustical feedback is likely to occur. Merely by way of example, feedback suppressor 10 is depicted as having a notch filter 20 variable over a portion of the audio frequency spectrum extending from frequencies of approximately 100 to 20,000 Hz. One hundred Hz was selected as the lower limit herein since it is approximately the lower frequency limit of the human voice and since it has been found that acoustical feedback only very rarely falls below such a frequency.

Notch filter 20 may be tuned to any number of discrete center frequencies as desired. However, the larger the number of center frequencies to which notch filter 20 is capable of being tuned, the greater the selectivity of feedback suppressor 10 and the more likely it is to suppress just the dominant feedback frequency without appreciable deleterious effects to the desired portion of the audio input signal. Thus, the number of discrete center frequencies should preferably be as large as is conveniently permitted by the notch filter control circuitry to be hereinafter described. Since binary logic is utilized in a manner explained below to determine the dominant feedback frequency, I have found the use of 256 center frequencies to be convenient.

Figure 3:
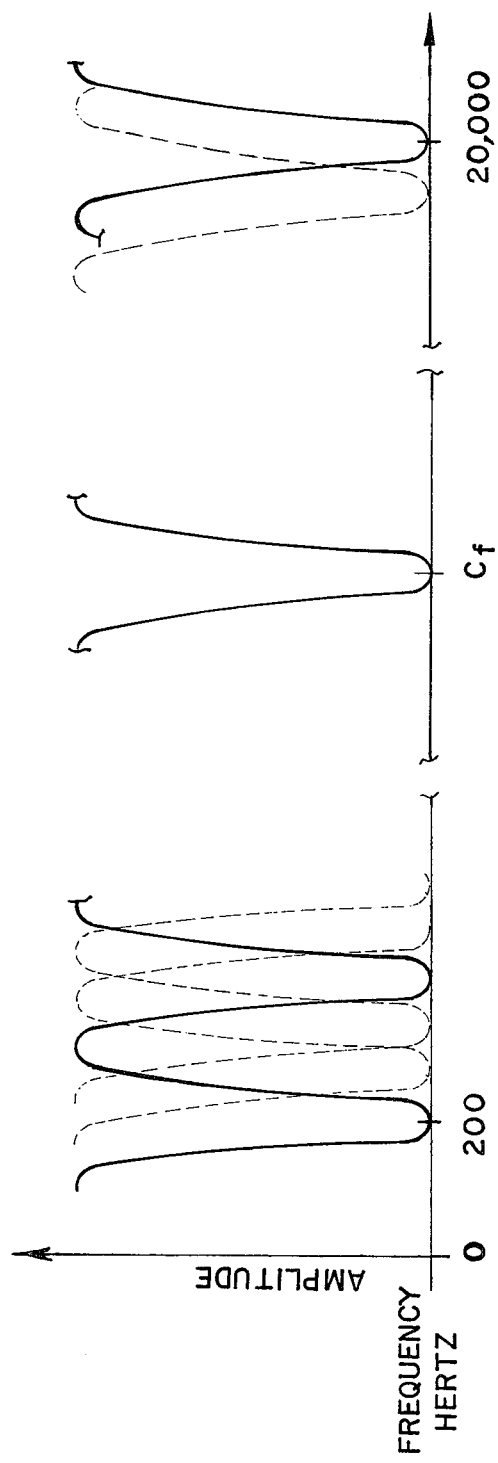
FIG. 3 is a graphical depiction of portions of the audio frequency spectrum, indicating an exemplary filter characteristic of the notch filter when tuned to various center frequencies.

Turning momentarily to FIG. 3, some of the 256 desired frequency band rejection characteristics of notch filter 20 are depicted over portions of the audio frequency spectrum. In particular, an exemplary band reject filter characteristic 21 is indicated with center frequency $C_f$, the other characteristics being similar. Again in order to insure the maximum possible selectivity of feedback suppressor 10, the filter characteristic 21 of notch filter 20 should preferably have as high a quality factor (hereinafter referred to as "Q") as is possible. However, since only a finite number of center frequencies are available, the "Q" must still be low enough to permit filtering of substantially all the frequencies within the portion of the audio frequency spectrum in which acoustical feedback is likely to occur. Thus, as indicated in FIG. 3, the filter characteristic 21 for each center frequency should preferably filter all frequencies between each adjacent filter characteristic 21 in the portion selected. With the use of 256 center frequencies, I have found that a notch filter 20 characteristic "Q" of approximately 80 provides adequate selectivity while still permitting filtering of the entire audio frequency spectrum.

Figure 4:
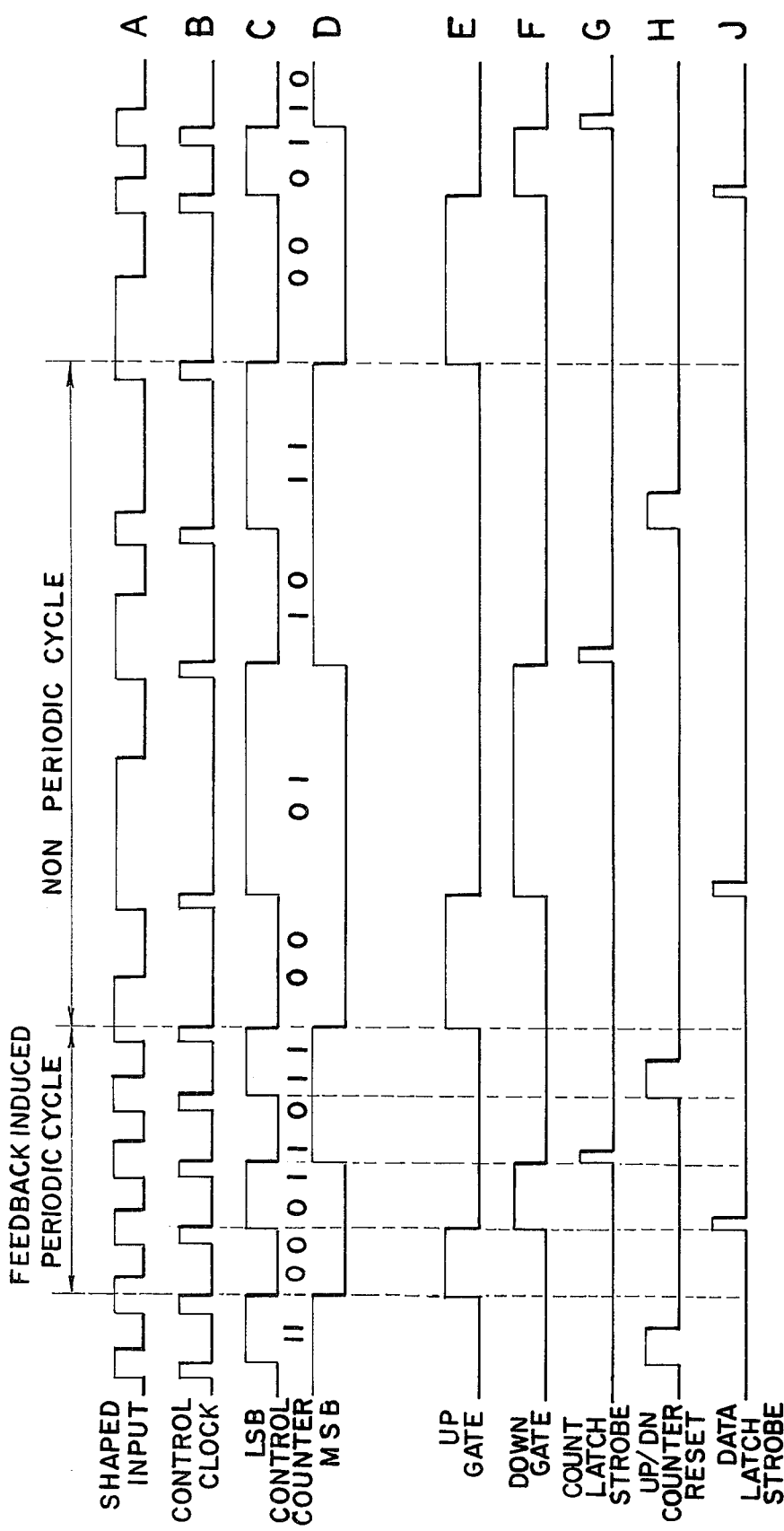
FIG. 4 is a somewhat schematic representation of voltage waveforms at various points in the apparatus depicted in FIG. 1. Waveforms A through J, inclusive, are coordinated in time although not necessarily to scale.

Returning to FIG. 1, a control clock 25 also receives the audio input signal and generates a control clock signal B illustrated in FIG. 4 as having a series of pulses, each pulse having a similar substantially constant amplitude and duration. In order to generate control clock signal B, control clock 25 may include a wave shaper (not shown) such as a conventional regenerative comparator (known in the art as a Schmitt trigger) receiving the audio input and providing a shaped input signal A illustrated in FIG. 4. Shaped input signal A includes a series of pulses each having leading and trailing vertical edges alternately triggered each time the audio input signal has a precise preset amplitude, such as the zero-crossing level previously explained. Shaped input signal A may be received by a monostable multivibrator (known in the art as a one-shot — not shown) which generates single pulses of short duration concomitant with the leading edge of each pulse of shaped input signal A. Thus, every alternate time the audio input signal has as its amplitude the precise preset level, a control clock pulse is generated. Where the preset amplitude equals the zero-crossing level, the frequency of these pulses is proportional to the instantaneous dominant frequency of the audio input signal. It is to be noted many techniques and circuit configurations are well known for generating a pulse train whose frequency is proportional to the frequency of an analog input signal and equally suitable for use herein.

Control clock signal B is received by cycle control logic 30 which sequentially provides five output command signals as explained below. In order to properly sequence these signals, a two-bit synchronous control counter (not shown) having four consecutive count periods may be included therein. The control counter output signals from both the least and most significant bits are depicted as C and D, respectively, in FIG. 4. Chronologically, each period shall be referred to hereinafter as the count up, count down, check, and reset periods and are illustrated in FIG. 4 by the base two numerals "00," "01," "10," and "11," respectively. Since these periods will continuously chronologically repeat themselves as long as there exists any audio input signal whatsoever, each complete sequence may be referred to as the control count cycle. It should be noted that although a two-bit synchronous control counter has been utilized to provide properly sequenced output command signals, many devices are known which provide appropriate sequencing signals and are suitable for use herein.

The five output command signals generated by cycle control logic 30 are illustrated in FIg. 4 as E, F, G, H, and J and shall hereinafter be referred to as the up gate, down gate, count latch strobe, up/down counter reset, and data latch strobe signals, respectively. It should be reiterated at this point that waveforms A through J, inclusive, are coordinated in time but not necessarily in amplitude.

Up gate signal E and down gate signal F, which may be respectively referred to as the first and second output command signals from cycle control logic 30, each provide a pulse whose duration equals the duration of the count up period and count down period respectively. Up/down counter reset signal H provides a pulse of a constant duration sufficient to reset up/down counter 40 but at most equal to the duration of the reset period. Data latch strobe signal J and count latch strobe signal G provide a pulse of short duration upon the completion of the up and down count periods respectively. The duration of the pulses in signals J and G must be less than that of the shortest possible control counter count period while still being long enough to activate their respective latches described hereinafter. An up gate 35 and a down gate 36, which both may be conventional AND gates, are depicted schematically within a gate circuit 37. Gates 35 and 36 receive up gate signal E and down gate signal F, respectively. Both gates 35 and 36 also receive the output signal from a count clock 38.

Count clock 38 is provided to increment an up/down counter 40 described below. For reasons to be explained hereinafter, count clock 38 must have a frequency greater than that of the greatest audio frequency at which acoustical feedback is likely to occur. Further, to insure greater accuracy in determining the dominant feedback frequency, it is preferable to provide count clock 38 with a frequency substantially greater than that of the maximum audio frequency (approximately 20,000 Hz) while still being compatible with the counting capacity and switching characteristics of the up/down counter 40. I have found a stable count clock frequency of 1 MHz to be acceptable.

Upon the coincidence of up gate signal E or down gate signal F with a count clock 38 output signal pulse, gates 35 and 36 increment up/down counter 40 up or down respectively. Up/down counter 40 may be any conventional up/down counter with sufficient counting capacity such that there exists at least one unique count corresponding to each available discrete center frequency of notch filter 20. Additional counting capacity should preferably be provided to insure that, given the frequency of count clock 38, the maximum up count corresponding to the lowest frequency one is desirous of filtering may be reached. For reasons previously explained, I have chosen a lower filter frequency of approximately 100 Hz. Using a 12-bit up/down counter and a 1 MHz count clock frequency, counts which occur with dominant acoustical feedback frequencies of down to 122 Hz may be achieved. However, due to external factors such as electrical noise, etc., there shall always exist a small degree of uncertainty in the final digit of the up/down counter 40. By providing a 12-bit up/down counter, but only utilizing the 8 most significant bits therein, a unique count is achieved for each of the 256 possible center frequencies while at the same time substantially eliminating uncertainty and enabling detection of dominant acoustical feedback frequencies of approximately 100 Hz.

Up/down counter 40 also receives up/down counter reset signal H, which resets up/down counter 40 to zero during the reset period within each control count cycle.

The output count from up/down counter 40 is received by both an end-of-count (hereinafter EOC) latch 41 and a filter data (hereinafter FD) latch 42. Both EOC latch 41 and FD latch 42 may be conventional latches with sufficient storage capacity to store at least one unique count corresponding to each available discrete center frequency. Specifically, 8-bit binary latches are utilized herein.

EOC latch 41 also receives count latch strobe signal G, which causes EOC latch 41 to store the up/down counter 40 final count upon the end of each down count period and hold the same until the end of the next down count period whereupon the EOC latch 41 is again updated with the then present final count. Thus, the final count stored within EOC latch 41 is indicative of whether acoustical feedback is present, the count difference being zero in the presence of the same since both the up and down count periods are equal. Similarly, FD latch 42 also receives data latch strobe signal J, which causes FD latch 42 to store the up/down counter 40 maximum up count upon the end of each up count period and hold the same until the end of the next up count period whereupon the FD latch 42 is again updated with the then present maximum up count. The maximum up count stored within FD latch 42 is indicative of the instantaneous dominant feedback frequency, the count being directly proportional to the period of then present acoustical feedback.

Since EOC latch 41 is instrumental in determining whether acoustical feedback is present, it may be considered to be an element of an enable circuit for the same purpose. The enable circuit further includes an equal count detector 43, a filter enabling circuit 44 when desired, an A.C. filter 45, and a programable read-only-memory (hereinafter PROM) enable comparator 46. Equal count detector 43 continuously receives the final count stored in EOC latch 41 and provides an equal count detector signal K having an output pulse whenever the up and down counts are equal, which will occur in the presence of acoustical feedback since such signal is periodic. Once an equal count has been detected, the output pulse from equal count detector 43 will remain high until the next unequal count occurs. Thus, the frequency of output pulses from equal count detector 43 is proportional to the periodicity of the audio input signal.

Occasionally, spurious electrical noise signals may erroneously trigger equal count detector 43 even in the absence of an audio input signal. In order to prevent notch filter 20 from being retuned to a center frequency in the absence of an audio input signal, filter enabling circuit 44 may be interposed between an A.C. filter 45 discussed below and equal count detector 43.

Filter enabling circuit 44 receives both the equal count detector signal K and the control clock signal B. As previously discussed, control clock signal B pulses are generated only in the presence of an audio input signal. By requiring the presence of control clock signal B pulses before permitting the equal count detector signal K to pass therethrough, filter enabling circuit 44 insures that equal count detector signal K will not be received by A.C. filter 45 and further processed unless an audio input signal is present. Feedback suppressor 10 will provide satisfactory operation in the absence of filter enabling circuit 44, thus rendering filter enabling circuit 44 a nonessential circuit to be furnished according to the manufacturer's desire.

A.C. filter 45 receives equal count detector signal K from filter enabling circuit 44 or, in its absence, directly from equal count detector 43. A.C. filter 45 may be a conventional low pass filter with a cutoff frequency sufficiently low to filter substantially all the A.C. component in equal count detector signal K. A.C. filter 45 serves to convert the digital pulse train output of equal count detector 43 into a continuous analog voltage proportional to the number and duration of equal count detector signal K pulses. Since the number and duration of equal count detector signal K pulses are proportional to the extent of the periodicity in the audio input waveform, the continuous analog voltage output of A.C. filter 45 is also proportional thereto. Thus, the longer a periodic audio input signal is received, the greater the likelihood of its being a feedback signal, and the greater the voltage output of A.C. filter 45.

PROM enable comparator 46, which may be a conventional comparator, receives the voltage output from A.C. filter 45. When the voltage output magnitude equals that preset into the comparator (i.e., when the probability of having acoustical feedback is sufficiently great to equal that preset into PROM enable comparator 46), an appropriate enable signal is generated and received by PROM 47, enabling tuning of notch filter 20 to that center frequency which corresponds to the present dominant feedback frequency.

Notch filter frequency control is achieved by use of FD latch 42, a programable read-only memory (PROM) 47, a digital-to-analog (hereinafter D/A) converter 48, and a voltage-to-resistance (hereinafter VCR) converter 49. FD latch 42 has the maximum up count for each control count cycle stored therein. The maximum up count is loaded into PROM 47 upon receipt of an appropriate enable signal from PROM enable comparator 46.

PROM 47 may be any conventional PROM with sufficient memory capacity to uniquely store each possible up/down counter 40 count. Since 256 unique 8-bit counts are possible in the embodiment described herein, a 2,048 bit (256 words each having 8 bits) PROM has been selected.

The particular notch filter 20 employed herein requires variable resistance input signal to be selectively, variably tuned. Once received from FD latch 42, the maximum upcount is translated by PROM 47 into a unique digital signal which, when converted to a variable resistance signal by D/A converter 48 and VCR converter 49, selectively tunes notch filter 20 to a center frequency corresponding to that frequency at which acoustical feedback is then occurring. In order to provide the correct unique digital signal, the digital signal for each notch filter center frequency can be experimentally determined and preset into PROM 47 prior to operation of feedback suppressor 10 such that upon receipt of a maximum up-count, PROM 47 outputs the unique digital signal which tunes notch filter 20 to that frequency at which acoustical feedback is then occurring.

It is generally desirable to prevent notch filter 20 from filtering the audio input signal when it is determined that no acoustical feedback signal exists. To this end, notch filter 20 may be constructed so as to automatically tune to a center frequency well outside the audio frequency spectrum whenever an enable signal is not present. However, if the enable signal was extinguished during the next successive control period after the present dominant feedback frequency was filtered out, the filter would also then retune to the center frequency well outside the audio frequency spectrum. If acoustical feedback still remains at the original dominant feedback frequency, notch filter 20 would again retune to this same dominant feedback frequency during the second successive control period. In order to prevent notch filter 20 from "toggling" in and out of the circuit during each alternate cycle, the time constant of A.C. filter 45 may be made sufficiently long so as to provide an enable signal for at least two control cycles.

Having described feedback suppressor 10 a typical operational sequence may now be detailed. In the presence of acoustical feedback, assumed to exist for the purpose of this discussion, the audio input signal becomes periodic. Cycle control logic 30 first initiates an up-count period. During the up-count period, count clock 38 pulses are gated through gate 35 into up/down counter 40, incrementing the same upwardly to some maximum up-count period. Upon the occurrence of the next alternate zero-crossing level, the next, or down-count period is begun, whereupon command signals from cycle control logic 30 store the present maximum up-count in FD latch 42 and begin incrementing up/down counter 40 downwardly.

Upon the occurrence of the next successive alternate zero-crossing level, the downward incrementation of up/down counter 40 ceases at some final count, whereupon a command signal from cycle control logic 30 stores the present final count in EOC latch 41.

Upon detection of a zero final count (which occurs only in the presence of a periodic signal), equal count detector 43 generates a pulse output signal which pulse is maintained until the occurrence of the next non-zero final count. This output pulse is converted to an analog signal by A.C. filter 45. Next the magnitude of the analog signal is compared to a preset level by PROM enable comparator 46 which outputs a pulse thereby enabling tuning of the filter frequency control to the instantaneous dominant feedback frequency.

The final count stored in FD latch 42 is loaded into PROM 47 upon receipt of an enable signal which then provides an output correlated to the instantaneous dominant feedback frequency. This signal is converted into a format capable of direct reception by notch filter 20 and tunes the notch filter to a center frequency equal to that of the instantaneous dominant feedback frequency.

In the absence of acoustical feedback the audio input signal is non-periodic thereby resulting in unequal up and downcount periods. Since these periods are unequal, equal count detector 43 fails to generate a pulse output, thereby preventing the generation of an enable signal. Of course, AC filter 20 will still provide an enable signal for at least one additional control cycle in order to prevent the "toggling" previously described. In the absence of an enable signal notch filter 20 is automatically tuned to a center frequency well outside the audio frequency spectrum.

Described herein has been an apparatus which monitors successive periods in an audio signal by counting the output pulses from a count clock during each period which has a frequency substantially greater than that of the maximum possible dominant feedback frequency. The apparatus then compares the counts for successive periods so as to determine the presence and dominant frequency of acoustical feedback. It must be understood that there are many well-known period detection and period comparison techniques and, when utilized herein, clearly fall within the scope of the present invention.

Inasmuch as the present invention is subject to many variations, modifications and changes in detail, a number of which have been expressly stated herein, it is intended that all matter described throughout this entire specification or shown in the accompanying drawings be interpreted as illustrative and not in a limiting sense. It should thus be evident that a device constructed according to the concept of the present invention, and reasonably equivalent thereto, will accomplish the objects of the present invention and otherwise substantially improve the art of suppressing acoustical feedback.

What is claimed is:

1. An apparatus for suppression of acoustical feedback in an audio input signal having a variable period comprising:

notch filter means for receiving and selectively filtering the audio input signal, said notch filter means having a center frequency which is variable over at least a substantial portion of the audio frequency spectrum, means to determine the presence of periodicity within the audio input signal and providing an output signal indicative thereof, and means for receiving the signal from said means to determine the presence of periodicity and selectively tuning said notch filter means to a center frequency substantially equal to the instantaneous dominant frequency of the audio input signal.

2. An apparatus, as in claim 1, wherein said means to determine the presence of periodicity includes:

count clock means for generating pulses of a substantially constant frequency, and sequential counter means for receiving the pulses from said count clock means, counting the same during successive periods of the audio input signal, and providing output signals indicative of the counts during said successive periods.

3. An apparatus, as in claim 2, wherein said means to determine the presence of periodicity further includes:

control clock means for receiving the audio input signal and generating pulses having a frequency proportional to the periodicity of said audio input signal, said frequency further being proportional to the instantaneous dominant feedback frequency in the presence of the same, cycle control logic means for receiving the output signal from said control clock means and providing once during a single cycle at least a first and a second output command signal, and said sequential counter means counting upwardly upon the coincidence of said first output command signal and the pulses from said count clock means, and counting downwardly upon the coincidence of said second output command signal and the pulses from said count clock means, said output signals being indicative of the maximum up-count and the final down-count achieved during each cycle.

4. An apparatus, as in claim 3, wherein said cycle control logic means provides a third output command signal for resetting said sequential counter means which is received by said sequential counter means.

5. An apparatus, as in claim 3, wherein said means to determine the presence of periodicity further includes:
   enable means for receiving the output signals from said sequential counter means and determining whether said maximum up-count and said final down-count achieved during each cycle are equal and providing an output signal indicative of same, which output signal is also indicative of the presence of periodicity within the audio input signal.

6. An apparatus, as in claim 5, wherein said means to determine the presence of periodicity includes gate means for receiving the pulses from said count clock means and said first and second output command signals, and providing an up-count signal upon the coincidence of said first output command signal and the pulses from said count clock means, and a down-count signal upon the coincidence of said second output command signal and the pulses from said second count clock means.

7. An apparatus, as in claim 5, wherein said enable means includes latch means for receiving said output signals from said sequential counter means and wherein said cycle control logic means provides a third output command signal, said latch means storing the final down-count of said sequential counter means achieved during each cycle upon receipt of an appropriate said third output command signal.

8. An apparatus, as in claim 7, wherein said enable means further includes equal count detector means for receiving said stored signal within said latch means and determining whether said up-count and said down-count within each cycle are equal, and providing an output signal indicative of same, equality being indicative of the presence of acoustical feedback.

9. An apparatus, as in claim 8, wherein said enable means further includes A.C. filter means for receiving the output signal from said count detector means, filtering substantially all the A.C. components therein, and providing an analog voltage output signal.

10. An apparatus, as in claim 9, wherein said enable means further includes memory enable comparator means for receiving the output signal from said A.C. filter means and providing an output signal in the presence of acoustical feedback enabling said means for selectively tuning to tune said notch filter means to the instantaneous dominant feedback frequency of said audio input signal.

11. An apparatus, as in claim 10, wherein said enable means further includes filter enable means for receiving the output signal from said equal count detector means and preventing receipt of same by said A.C. filter means unless an audio input signal is present.

12. An apparatus, as in claim 1, wherein said means to determine includes:
   count clock means for generating pulses of a substantially constant frequency,
   control clock means for receiving the audio input signal and generating pulses having a frequency proportional to the instantaneous dominant feedback frequency of said audio input signal,
   cycle control logic means for receiving the output signal from said control clock means and providing once during a single cycle at least a first and a second output command signal,
   sequential counter means for receiving the pulses from said count clock means, counting the same during successive periods of the audio input signal, and providing output signals indicative of the counts during said successive periods, said sequential counter means counting upwardly upon the coincidence of said first output command signal and the pulses from said count clock means, and counting downwardly upon the coincidence of said second output command signal and the pulses from said count means, said output signals being indicative of the maximum up-count and the final down-count achieved during each cycle,
   enable means for receiving the output signals from said sequential counter means and determining whether said maximum up-count and said final down-count achieved during each cycle are equal, and for providing an output signal indicative of same, which output signal is also indicative of the presence of periodicity within the audio input signal; and
   said means for selectively tuning includes: filter frequency control means for providing an output signal for directly selectively tuning said notch filter means to the instantaneous dominant frequency of the audio input signal.

13. An apparatus, as in claim 12, wherein said cycle control logic means provides a third output command signal and said filter frequency control means includes latch means for receiving said output signal indicative of said maximum up-count and said third output command signal from said cycle control logic means, and storing the maximum up-count of said sequential counter means achieved during each cycle upon receipt of an appropriate said third output command signal.

14. An apparatus, as in claim 13, wherein said filter frequency control means further includes memory means for receiving said stored signal within said latch means and providing an output signal correlated to the instantaneous dominant feedback frequency of the audio input signal.

15. An apparatus, as in claim 14, wherein the output signal from said memory means is digital, said filter frequency control means further including converter means for receiving the digital output signal from said memory means and converting the same to an analog signal.

16. An apparatus, as in claim 15, wherein the output signal from said memory means has its voltage magnitude correlated to the instantaneous dominant feedback frequency of the audio input signal, said filter frequency control means further including second converter means for receiving the analog voltage output signal from said converter means and supplying an output resistance which is correlated in value to said analog voltage output signal such that the output resistance of said second converter means is correlated to the instantaneous dominant feedback frequency of the audio input signal, said notch filter means receiving said analog signal output resistance.

17. A method for suppression of acoustical feedback in an audio input signal comprising the steps of:
   receiving the audio input signal, which signal is substantially non-periodic in the absence of acoustical feedback and substantially periodic in the presence of same, the audio input signal having an instantaneous dominant frequency when the audio input signal is substantially periodic, determining whether the audio input signal is substantially periodic, selectively tuning a notch filter having a center frequency which is variable over at least a substantial portion of the audio frequency spectrum to the instantaneous dominant frequency of the audio input signal upon the occurrence of a periodic audio input signal, and selectively filtering the audio input signal through said notch filter.

18. A method, as in claim 17, wherein the step of determining whether the audio input signal is substantially periodic further includes the steps of:

monitoring the duration of successive periods of said audio input signal, and comparing the duration of successive periods to determine the presence of acoustical feedback, the duration of said periods being equal in the presence of acoustical feedback.

19. A method, as in claim 17, wherein the step of selective filtering occurs intermittently and only upon the occurrence of a periodic audio input signal.

20. A method, as in claim 18, wherein the step of monitoring successive periods further includes the steps of:

counting upwardly from a preset number to a maximum up-count during a first period, counting downwardly from the maximum up-count achieved during said first period to a final count during the next successive period, and detecting whether said final count equals said preset number.

21. A method, as in claim 20, wherein the step of selectively tuning a notch filter further includes the steps of:

storing said maximum up-count, and converting said maximum up-count to a signal capable of selectively tuning said notch filter, said converting only occurring upon detection of a final count which equals said preset number.

22. A method, as in claim 21, wherein the step of monitoring successive periods further includes the step of storing said final count.

* * * * *